US012680021B2

(12) United States Patent
Lopez Villanueva et al.

(10) Patent No.: US 12,680,021 B2
(45) Date of Patent: Jul. 14, 2026

(54) COMPOSITION, ITS USE AND A PROCESS FOR SELECTIVELY ETCHING SILICON-GERMANIUM MATERIAL

(71) Applicant: BASF SE, Ludwigshafen am Rhein (DE)

(72) Inventors: Francisco Javier Lopez Villanueva, Ludwigshafen (DE); Andreas Klipp, Ludwigshafen (DE); Sabine Frischhut, Ludwigshafen (DE); Chih Hui Lo, Taoyuan (TW); Mei Chin Shen, Taoyuan (TW)

(73) Assignee: BASF SE, Ludwigshafen am Rhein (DE)

(*) Notice: Subject to any disclaimer, the term of this patent is extended or adjusted under 35 U.S.C. 154(b) by 216 days.

(21) Appl. No.: 18/042,315

(22) PCT Filed: Aug. 18, 2021

(86) PCT No.: PCT/EP2021/072975
§ 371 (c)(1),
(2) Date: Feb. 21, 2023

(87) PCT Pub. No.: WO2022/043165
PCT Pub. Date: Mar. 3, 2022

(65) Prior Publication Data

US 2023/0326759 A1 Oct. 12, 2023

(30) Foreign Application Priority Data

Aug. 24, 2020 (EP) .................................... 20192464

(51) Int. Cl.
*C09K 13/00* (2006.01)
*H10P 50/64* (2026.01)

(52) U.S. Cl.
CPC ............ *C09K 13/00* (2013.01); *H10P 50/642* (2026.01)

(58) Field of Classification Search
CPC .............. C09K 13/00; H01L 21/30608; H01L 21/30604; H10P 50/642
USPC ................................................ 252/79.1–79.5
See application file for complete search history.

(56) References Cited

U.S. PATENT DOCUMENTS

2010/0219383 A1* 9/2010 Eklund .................. B82Y 40/00 204/173
2015/0216056 A1* 7/2015 Teshima ................ H05K 3/022 228/124.1

(Continued)

FOREIGN PATENT DOCUMENTS

EP 3447791 A1 2/2019
KR 20180019237 A 2/2018

(Continued)

OTHER PUBLICATIONS

International Search Report and Written Opinion for corresponding PCT/EP2021/072975 mailed Nov. 5, 2021; 9 pages.

(Continued)

*Primary Examiner* — Anita K Alanko
(74) *Attorney, Agent, or Firm* — Armstrong Teasdale LLP

(57) ABSTRACT

Disclosed herein is a composition for selectively etching a layer including a silicon germanium alloy (SiGe) in the presence of a layer including silicon, the composition including:
(a) 5 to 15% by weight of an oxidizing agent;
(b) 5 to 20% by weight of an etchant comprising a source of fluoride ions;
(Continued)

(c) 0.001 to 3% by weight of a first selectivity enhancer of formula S1

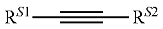

(S1)

and (d) water.

21 Claims, 4 Drawing Sheets

(56) References Cited

U.S. PATENT DOCUMENTS

| | | | | |
|---|---|---|---|---|
| 2019/0284704 | A1* | 9/2019 | Ge | H01L 21/32134 |
| 2020/0172808 | A1* | 6/2020 | Bjelopavlic | H01L 21/30604 |
| 2025/0109332 | A1* | 4/2025 | Lopez Villanueva | C09K 13/00 |
| 2025/0115809 | A1* | 4/2025 | Lopez Villanueva | C09K 13/08 |

FOREIGN PATENT DOCUMENTS

| | | | |
|---|---|---|---|
| KR | 20180107262 | A | 10/2018 |
| KR | 20190020079 | A | 2/2019 |
| KR | 20190087555 | A | 7/2019 |
| KR | 20190122832 | A | 10/2019 |
| WO | 2020083809 | A1 | 4/2020 |
| WO | 2020120667 | A1 | 6/2020 |

OTHER PUBLICATIONS

European Search Report for EP Patent Application No. 20192464.4, Issued on Jan. 22, 2021, 3 pages.

* cited by examiner

COMPOSITION, ITS USE AND A PROCESS FOR SELECTIVELY ETCHING SILICON-GERMANIUM MATERIAL

CROSS-REFERENCE TO RELATED APPLICATIONS

This application is a U.S. National Phase Application of International Patent Application No. PCT/EP2021/072975, filed Aug. 18, 2021, which claims priority to European Patent Application No. 20192464.4, filed Aug. 24, 2020, each of which is hereby incorporated by reference herein.

The present invention relates to a composition, its use and a process for selectively etching silicon-germanium material at a surface of a microelectronic device substrate, relative to etching a material comprising silicon at the same surface.

BACKGROUND OF THE INVENTION

Steps of preparing certain microelectronic devices, e.g., integrated circuits, may include selectively removing silicon-germanium (SiGe) material from a surface that contains the SiGe in combination with silicon (Si). According to certain example fabrication steps, SiGe may be used as a sacrificial layer in a structure that also contains silicon. Based on such fabrication steps, advanced device structures may be prepared, such as silicon nanowires and silicon on nothing (SON) structures. Steps in these processes include epitaxial deposition of a structure of alternating layers of Si and SiGe, followed by patterning and, eventually, selective lateral etching to remove the SiGe layers and generate a three-dimensional silicon structure.

In certain specific methods of preparing a field effect transistors (FET) for an integrated circuit, Si and SiGe materials are deposited as layers onto a substrate, i.e., as an "epitaxial stack" of Si and SiGe. The layers are subsequently patterned using standard techniques, such as by use of a standard lithographically generated mask. Next, a directional isotropic etch may be useful to laterally etch away the sacrificial SiGe material, leaving behind a silicon nanowire or sheet structure.

To enable smaller structures within Semiconductor structures electronic industry is searching for solutions to remove SiGe layers selectively against amorphous or crystalline silicon. This is needed to realize well defined nanowire or nanosheet structures.

EP 3 447 791 A1 discloses an etching solution for the selective removal of silicon-germanium over poly silicon from a microelectronic device comprising water, an oxidizer, a water-miscible organic solvent, a fluoride ion source, and optionally a surfactant. Example 5 discloses a composition comprising $H_2O_2$, $NH_4F$, butyl diclycol, citric acid, and Surfynol® 485, that is a polyethoxylated dialkyl acetylene compound having an ethylene oxide content (mole) of 30 and aids in the suppression of poly Si etch rate.

However, the state-of-the-art solutions are not able to fulfil all requirements since they have at least one of the following deficiencies:

(a) a too low SiGe/Si selectivity, to remove the SiGe layer(s) without attacking the Si layer;

(b) a too low SiGe etch rate which leads to a long time to completely remove the SiGe layer(s).

It is therefore an object of the invention to increase the SiGe/Si selectivity without reducing the etch rate with respect to SiGe too much.

SUMMARY OF THE INVENTION

It has now been found that the use of low amounts of an acetylenic hydroxy compound and its derivatives significantly and selectively improve the SiGe/Si selectivity since the etching rate of silicon containing layers, particularly Si layers is much more reduced than the etching of the SiGe layer.

Therefore, one embodiment of the present invention is a composition for selectively etching a layer comprising a silicon germanium alloy (SiGe) in the presence of a layer comprising or consisting of silicon, the composition comprising:

(a) 5 to 15% by weight of an oxidizing agent;

(b) 5 to 20% by weight of an etchant comprising a source of fluoride ions;

(c) 0.001 to 3% by weight of a first selectivity enhancer of formula S1

$$R^{S1} - \equiv - R^{S2} \quad (S1)$$

and (d) water, wherein $R^{S1}$ is selected from $X^S$—OH and $Y^S$—(CO)—OH $R^{S2}$ is selected from (i) $R^{S1}$, (ii) H, (iii) $C_1$ to $C_{10}$ alkyl, (iv) $C_1$ to $C_{10}$ alkenyl, (v) $C_1$ to $C_{10}$ alkynyl, and (vi) —$X^S$—(O—$C_2H_3R^{S6}$)$_m$—$OR^{S6}$;

$R^{S6}$ is selected from H and $C_1$ to $C_6$ alkyl;

$X^S$ is selected from a linear or branched $C_1$ to $C_{10}$ alkanediyl, a linear or branched $C_2$ to $C_{10}$ alkenediyl, linear or branched $C_2$ to $C_{10}$ alkynediyl, and —$X^{S1}$—(O—$C_2H_3R^6$)$_m$—;

$Y^S$ is selected from a chemical bond and $X^S$;

$X^{S1}$ is a $C_1$ to $C_6$ alkanediyl;

m is an integer of from 1 to 10.

It was particularly surprising that the etching composition according to the invention is suited to allow for a very controlled and selective etching of layers comprising or consisting of SiGe alloys, preferably of a SiGe25 layer, even of thin or ultra-thin layers comprising germanium ("Ge layers"), particularly layers comprising or consisting of SiGe alloys, while at the same time not or not significantly compromising layers comprising or consisting of silicon, particularly amorphous or crystalline silicon (Si), most particularly amorphous silicon (aSi).

Another embodiment of the present invention is the use of the compositions described herein for selectively etching a layer comprising SiGe in the presence of a layer comprising or consisting of silicon.

Yet another embodiment of the present invention is a process for selectively removing a layer comprising silicon-germanium from a surface of a microelectronic device relative to a layer comprising or consisting of Si, the process comprising:

(a) providing a microelectronic device surface that includes silicon and silicon-germanium, (b) providing a composition as described herein, and (c) contacting the surface with the composition for a time and at a temperature effective to selectively remove the layer comprising silicon-germanium relative to the layer comprising or consisting of silicon.

DETAILED DESCRIPTION OF THE INVENTION

Figure 1:
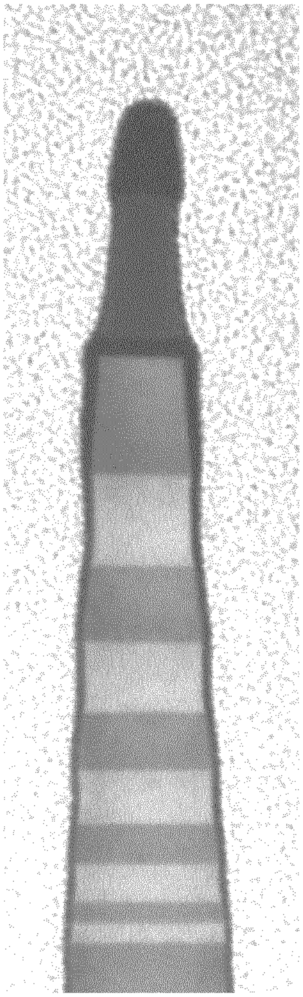
FIG. 1 shows the untreated substrate used in the Examples
Figure 2:
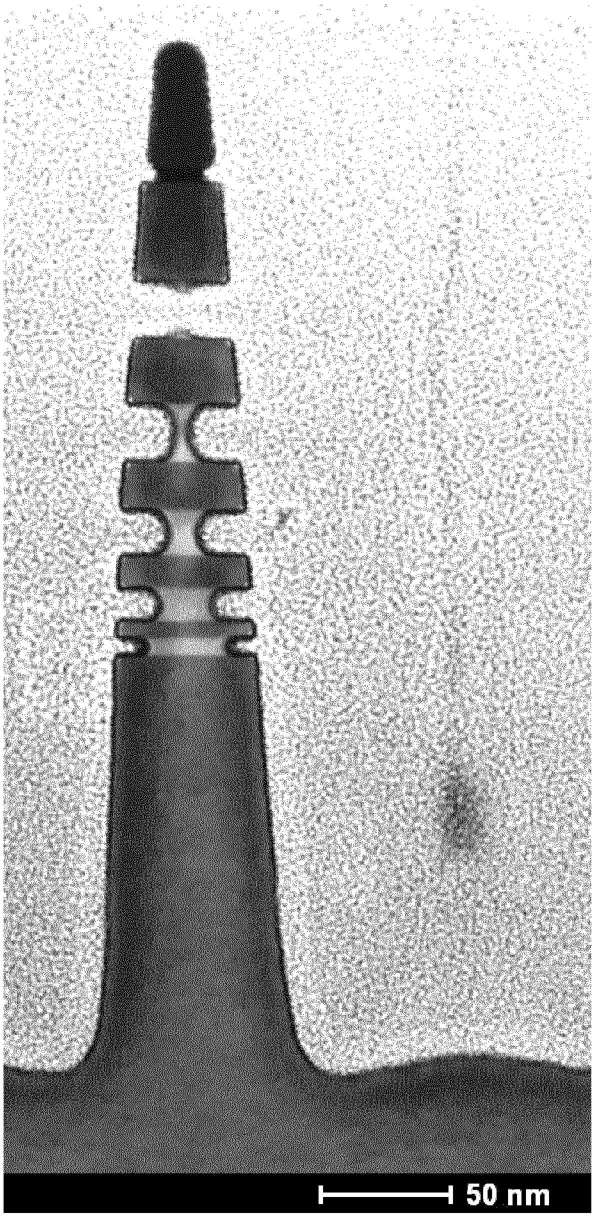
FIG. 2 shows the resulting substrate after having performed Example 1.2
Figure 3:
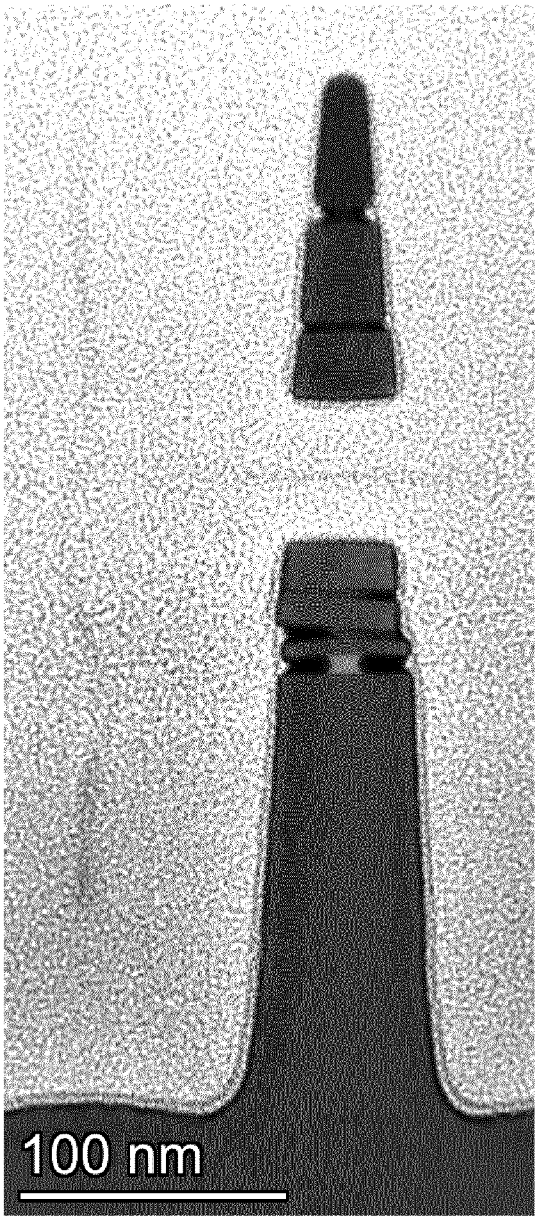
FIG. 3 shows the resulting substrate after having performed Example 3.2
Figure 4:
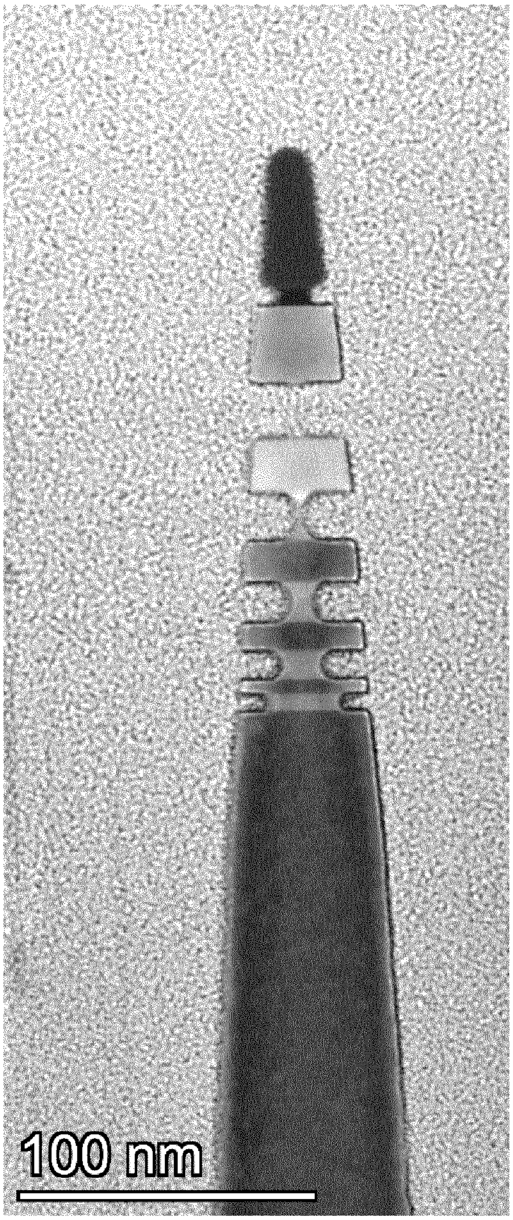
FIG. 4 shows the resulting substrate after having performed Example 4.2

The purpose of the etching composition is etching of silicon-germanium-containing layers in the presence of layers comprising silicon. The composition of the subject invention comprises (a) 5 to 15% by weight of an oxidizing agent; (b) 5 to 20% by weight of an etchant comprising a source of fluoride ions; (c) 0.001 to 3% by weight of a first selectivity enhancer of formula S1

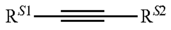

(S1)

and (d) water, as further described below.

Definitions

As used herein, a "layer comprising silicon" or "Si-layer" include, but is not limited to, a layer comprising or consisting of amorphous or crystalline silicon (Si); p-doped silicon; n-doped silicon; silicon oxide ($SiO_x$), including gate oxides (e.g., thermally or chemically grown $SiO_2$) and TEOS; silicon nitride (SiN); silicon oxynitride (SiON); thermal oxide; SiOH; SiCOH; titanium silicide; tungsten silicide; nickel silicides; cobalt silicides; and low-k dielectric materials. The etching composition is particularly useful when etching SiGe in the presence of Si, in particular amorphous silicon (aSi). It should be appreciated that for the purpose of this application, materials or layers comprising silicon do not include substantial amounts of germanium, i.e., the materials or layers contain less than 5% by weight germanium, preferably less than 2% by weight germanium, more preferably less than 1% by weight germanium, even more preferably less than 0.1% by weight germanium, most preferably essentially no germanium, i.e. devoid of any amounts of germanium that influence the etching of the layer.

As used herein, "silicon oxide" or "$SiO_x$" layers correspond to layers that were deposited from a silicon oxide precursor source, e.g., TEOS, thermally deposited silicon oxide, or carbon doped oxides (CDO) deposited using commercially available precursors such as SiLK™, AURORA™, CORAL™ or BLACK DIAMOND™. "Silicon oxide" is meant to broadly include SiO&, CDO's, siloxanes and thermal oxides. Silicon oxide or $SiO_x$ material corresponds to pure silicon oxide ($SiO_2$) as well as impure silicon oxide including impurities in the structure.

As used herein, the "silicon-germanium-containing layers" or "SiGe layers" correspond to layers comprising or consisting of silicon-germanium (SiGe) alloys known in the art and represented by the formula: $Si_xGe_y$, wherein x is in a range from about 0.70 to 0.90, and y is in a range from about 0.10 to about 0.30, with x+y=1.00. SiGe25 here means that y is 0.25.

As used herein, the formula SiGe will be used to signify the silicon germanium material to be removed.

As used herein, the term "selectively etching" (or "selective etch rate") preferably means that upon applying a composition according to the invention to a layer comprising or consisting of a first material, in this case SiGe, in the presence of a layer comprising or consisting of a second material, in this case a material comprising or consisting of silicon, particularly Si, most particularly aSi, the etch rate of said composition for etching the first layer is at least 500 times, preferably at least 1000 times, the etch rate of said composition for the second layer. Depending on the substrate to be etched, other layers comprising or consisting of silicon like $SiO_x$, SiON or SiN should also not be jeopardized.

As used herein, the term "layer" means a part of a substrate that was separately disposed on the surface of a substrate and has a distinguishable composition with respect to adjacent layers.

As used herein, "chemical bond" means that the respective moiety is not present but that the adjacent moieties are bridged so as to form a direct chemical bond between these adjacent moieties. By way of example, if in a molecule A-B-C the moiety B is a chemical bond then the adjacent moieties A and C together form a group A-C.

The term "$C_x$" means that the respective group comprises x numbers of C atoms. The term "$C_x$ to $C_y$ alkyl" means alkyl with a number x to y of carbon atoms and, unless explicitly specified, includes unsubstituted linear, branched and cyclic alkyl. As used herein, "alkanediyl" refers to a diradical of linear, branched or cyclic alkanes or a combination thereof.

All percent, ppm or comparable values refer to the weight with respect to the total weight of the respective composition except where otherwise indicated. The term wt % means % by weight.

All cited documents are incorporated herein by reference.

Oxidizing Agent

The etching composition according to the invention comprises an oxidizing agent. The oxidizing agent, also referred to as "oxidizer", may be one or more compounds that are capable of oxidizing Germanium within Silicon Germanium alloys.

Oxidizing agents contemplated herein include, but are not limited to, hydrogen peroxide, $FeCl_3$, $FeF_3$, $Fe(NO_3)_3$, $Sr(NO_3)_2$, $CoF_3$, $MnF_3$, oxone ($2KHSO_5$ $KHSO_4$ $K_2SO_4$), periodic acid, iodic acid, vanadium (V) oxide, vanadium (IV,V) oxide, ammonium vanadate, ammonium peroxymonosulfate, ammonium chlorite, ammonium chlorate, ammonium iodate, ammonium nitrate, ammonium perborate, ammonium perchlorate, ammonium periodate, ammonium persulfate, ammonium hypochlorite, ammonium hypobromite, ammonium tungstate, sodium persulfate, sodium hypochlorite, sodium perborate, sodium hypobromite, potassium iodate, potassium permanganate, potassium persulfate, nitric acid, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxymonosulfate, peroxymonosulfuric acid, ferric nitrate, urea hydrogen peroxide, peracetic acid, methyl-1,4-benzoquinone (MBQ), 1,4-benzoquinone (BQ), 1,2-benzoquinone, 2,6-dichloro-1,4-benzoquinone (DCBQ), toluquinone, 2,6-dimethyl-1,4-benzoquinone (DMBQ), chloranil, alloxan, N-methyl-morpholine N-oxide, trimethylamine N-oxide, and combinations thereof. The oxidizing species may be introduced to the composition at the manufacturer, prior to introduction of the composition to the device wafer, or alternatively at the device wafer, i.e., in situ.

Preferably the oxidizing agent comprises or consists of a peroxide. Useful peroxides may be but are not limited to hydrogen peroxide or peroxymonosulfuric acid and organic acid peroxides like peroxyacetic acid, and their salts.

The most preferred oxidizing agent is hydrogen peroxide.

The oxidizing agent may be used in an amount of from about 5 to about 15% by weight, preferably of from about 6 to about 14% by weight, more preferably of from about 7 to about 13% by weight, most preferably of from about 8 to about 12% by weight, based on the total weight of the composition.

Etchant

The etching composition according to the invention comprises a source of fluoride ions which may be any compound that is capable of releasing fluoride ions.

Preferred etchants are selected from but not limited to the group consisting of ammonium fluoride, ammonium bifluoride, triethanolammonium fluoride, diglycolammonium fluoride, methyldiethanolammonium fluoride, tetramethylammonium fluoride, triethylamine trihydrofluoride, hydrogen fluoride, fluoroboric acid, tetrafluoroboric acid, ammonium tetra-fluoro-borate, fluoroacetic acid, ammonium fluoroacetate, trifluoroacetic acid, fluorosilicic acid, ammonium fluorosilicate, tetrabutylammonium tetrafluoroborate, and mixtures thereof. Preferably the etchant consists of one or more, most preferably one of the said compounds.

Most preferably the etchant comprises or consists of ammonium fluoride, ammonium hydrogen fluoride, and hydrogen fluoride. Most preferably the etchant comprises or consists of ammonium fluoride.

The etching compositions according to the invention comprising ammonium fluoride as the etchant have shown a stable and reproducible controlled selective etch rate for etching a layer comprising or consisting of SiGe, in particular SiGe25, in the presence of a layer comprising or consisting of Si.

The etchant may be used in an amount of from about 5 to about 20% by weight, preferably of from about 8 to about 18% by weight, more preferably of from about 10 to about 17.5% by weight, most preferably of from about 12 to about 16% by weight, based on the total weight of the composition.

Compositions according to the invention comprising the etchant in the here defined preferred total amounts have shown a superior etch rate, in particular for etching a layer comprising or consisting of SiGe, preferably of SiGe25, and etch rate selectivity, in the presence of a layer comprising or consisting of Si.

SiGe Selectivity Enhancer

It has been found that a selectivity enhancer (also referred to as "first selectivity enhancer") of formula S1

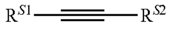

(S1)

selectively reduces the etch rate of layers comprising or consisting of Si, whereas the etch rate of layers comprising or consisting of SiGe, preferably of SiGe25, are still high, which leads to SiGe/a-Si selectivities above 500 or even above 1000.

In Formula S1 $R^{S1}$ may be selected from $X^S$—OH and $Y^S$—(CO)—OH, wherein $X^S$ may be a linear or branched $C_1$ to $C_{10}$ alkanediyl, a linear or branched $C_2$ to $C_{10}$ alkenediyl, linear or branched $C_2$ to $C_{10}$ alkynediyl, or a polyoxyalkylene group —$X^{S1}$—$(O—C_2H_3R^6)_m$—; $Y^{S1}$ may be the same as $X^S$ or may be a chemical bond. If $R^{S1}$ is a polyoxyalkylene group, $X^{S1}$ may be a $C_1$ to $C_6$ alkanediyl, preferably ethanediyl, propanediyl or butanediyl; furthermore, it is important that m is integer selected from 1 to 10, preferably from 1 to 5, even more preferably from 1 to 3, most preferably from 1 to 2. The higher m is the lower is the effect of the selectivity enhancer. If m is too high, the selectivity enhancers do not sufficiently reduce the a-Si, $SiO_x$, SiON or SiN etch rates.

$R^{S2}$ may be selected from $R^{S1}$, preferably $R^{S2}$ is the same as $R^{S1}$ describe above. Alternatively $R^{S2}$ may be (ii) H, (iii) a $C_1$ to $C_{10}$ alkyl, (iv) a $C_1$ to $C_{10}$ alkenyl, (v) a $C_1$ to $C_{10}$ alkynyl, and (vi) —$X^{S1}$—$(O—C_2H_3R^{S6})_m$—$OR^{S6}$, wherein $X^{S1}$ is a $C_1$ to C alkanediyl, preferably ethanediyl, propanediyl or butanediyl; $R^{S6}$ is selected from H and $C_1$ to $C_6$ alkyl, preferably H, methyl or ethyl; and m may be an integer of from 1 to 10.

Most preferably $R^{S1}$ and $R^{S2}$ are the same.

In a first preferred embodiment $R^{S1}$ may be $X^S$—OH. Preferably $X^S$ may be a $C_1$ to $C_8$ alkanediyl, more preferably a $C_1$ to C alkane-1,1-diyl.

Preferably $X^S$ is selected from a $C_3$ to $C_{10}$ alkanediyl, more preferably from $C_4$ to C alkanediyl.

Particularly preferably $X^S$ is selected from methanediyl, ethane-1,1-diyl, and ethane-1,2-diyl. In a another preferred embodiment $X^S$ is selected from propan-1,1-diyl, butane-1,1-diyl, pentane-1,1-diyl, and hexane-1,1-diyl. In yet another preferred embodiment $X^S$ is elected from propane-2-2-diyl, butane-2,2-diyl, pentane-2,2-diyl, and hexane-2,2-diyl. In yet another preferred embodiment $X^S$ is elected from propane-1-2-diyl, butane-1,2-diyl, pentane-1,2-diyl, and hexane-1,2-diyl. In yet another preferred embodiment $X^S$ is elected from propane-1-3-diyl, butane-1,3-diyl, pentane-1,3-diyl, and hexane-1,3-diyl. Particular preferred groups $X^S$ are butane-1,1-diyl, pentane-1,1-diyl, and hexane-1,1-diyl, heptane-1,1-diyl and octane-1,1-diyl.

Preferably the first selectivity enhancer is a compound of formula S2

(S2)

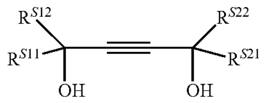

wherein $R^{S11}$, $R^{S21}$ are independently selected from a $C_1$ to $C_{10}$ alkyl, preferably from ethyl, propyl, butyl, pentyl and hexyl, most preferably from propyl, butyl, or pentyl.

$R^{S12}$, $R^{S22}$ are independently selected from H and a $C_1$ to $C_4$ alkyl, preferably H, methyl or ethyl.

Most preferably the (first) selectivity enhancer may be a compound of formula S4

(S4)

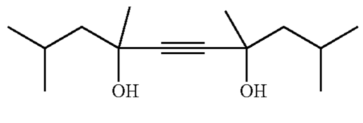

available from Evonik under the trade name Surfynol® 104.

The selectivity enhancer of the first preferred embodiment may be present in an amount of from about 0.0005 to about 0.02% by weight, preferably of from about 0.001 to about 0.005% by weight, most preferably of from about 0.002 to about 0.004% by weight. A single selectivity enhancer may increase the SiGe/Si selectivity up to more than 500, preferably more than 750, most preferably more than 1000.

In a second preferred embodiment, $R^{S1}$ may be $Y^S$—(CO)—OH, wherein $Y^{S1}$ may be a chemical bond or the same as $X^S$ described above.

Preferably the (first) selectivity enhancer may be a compound of formula S3

(S3)

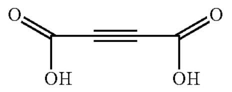

The selectivity enhancer of the second preferred embodiment may be present in an amount of from about 0.1 to about 3% by weight, preferably of from about 0.5 to about 2% by weight.

The composition according to the invention may comprise one or more of the selectivity enhancers described herein.

A particularly preferred composition comprises one single selectivity enhancer of the first preferred embodiment, particularly one single selectivity enhancer of formula S2 or formula S4.

Another particularly preferred composition comprises a first selectivity enhancer of the first preferred embodiment, particularly a first selectivity enhancer of formula S2 or formula S4; and further comprises a second selectivity enhancer of the second preferred embodiment, particularly a second selectivity enhancer of formula S3. If a first selectivity enhancer of formula S2 or formula S4 and a second selectivity enhancer of formula S3 are used the weight ratio of first and the second selectivity enhancer preferably is from 0.0001 to 0.1, most preferably from 0.001 to 0.02. The combination of a first and a second selectivity enhancer may increase the SiGe/Si selectivity up to more than $10^4$.

Acid

The etching composition according to the invention may further comprise an acid. Such acid may be an inorganic acid, an organic acid, or a combination thereof. Preferably the acid is an organic acid or a combination of an inorganic acid and an organic acid.

Typical inorganic acids may be selected from but are not limited to sulfuric acid or phosphoric acid. Preferably, the inorganic acid comprises or consists of a strong inorganic acid, particularly sulfuric acid.

Typical organic acids may be selected from but are not limited to $C_1$ to $C_{10}$ mono, di or tri carboxylic acids, sulfonic acids, phosphonic acids, and the like.

In a preferred embodiment, the acid comprises or consists of a hydroxy carboxylic acid, particularly but not limited to citric acid. In another preferred embodiment the acetylenic compound, such as but not limited to acetylene dicarboxylic acid, also has acidic properties and therefore no further acid is required.

If present, the acid may be used in the etching composition in an amount of from about 0.1% to about 5% by weight, more preferably of from about 0.2% to about 4% by weight, even more preferably of from about 0.3% to about 3% by weight most preferably of from about 0.5 to about 2% by weight.

Organic Solvents

Even not preferred, the etching composition may optionally comprise one or more organic solvents.

In individual cases, a composition according to the invention as defined herein may further comprise as an optional additional component: One or more water-miscible organic solvents, preferably selected from the group consisting of tetrahydrofuran (THF), N-methylpyrrolidone (NMP), dimethyl formamide (DMF), dimethyl sulfoxide (DMSO), ethanol, isopropanol, butyldiglycol, butylglycol, sulfolane (2,3,4,5-tetrahydrothiophene-1,1-dioxide) and mixtures thereof; more preferably selected from the group consisting of THF, NMP, DMF, DMSO, sulfolane and mixtures thereof.

The term "water-miscible organic solvent" in the context of the present invention preferably means that an organic solvent fulfilling this requirement is miscible with water at least in a 1:1 (w/w) ratio at 20° C. and ambient pressure. Preferably the or at least one water-miscible organic solvent (H) is sulfolane. Particularly, preferred are compositions according to the present invention which do not comprise one or more water-miscible organic solvents.

In individual cases, a composition according to the invention as defined herein (or a composition according to the invention as described above or below as being preferred) is preferred wherein the total amount of the one or more water-miscible organic solvents, (i.e. the solvent component) present in an amount of from about 0.1 to about 30% by weight, preferably of from about 0.5 to about 10% by weight, more preferably of from about 1 to about 7.5% by weight, even more preferably of from about 1 to about 6% by weight, based on the total weight of the composition.

Most preferably the etching composition is an aqueous solution that is essentially free of organic solvents. Essentially free herein means that the content of organic solvents is below 1% by weight, preferably below 0.1% by weight, even more preferably below 0.01% by weight, most preferably below the detection limit.

Surfactants

The composition may also further comprise one or more surfactants.

Preferred surfactants are selected from the group consisting of (i) anionic surfactants, preferably selected from the group consisting of ammonium lauryl sulfate, fluorosurfactants, preferably selected from the group consisting of perfluorinated alkylsulfonamide salts (preferably perfluorinated, N-substituted alkylsulfonamide ammonium salts, PNAAS), perfluorooctanesulfonate, perfluorobutanesulfonate, perfluorononanoate and perfluorooctanoate; alkyl-aryl ether phosphates and alkyl ether phosphates;

(ii) zwitterionic surfactants, preferably selected from the group consisting of (3-[(3-cholamidopropyl)dimethylammonio]-1-propanesulfonate) ("CHAPS"), cocamidopropyl hydroxysultaine (CAS RN 68139-30-0), {[3-(dodecanoylamino)propyl](dimethyl)-ammonio}acetate, phosphatidylserine, phosphatidylethanolamine, phosphatidylcholine; and (iii) non-ionic surfactants, preferably selected from the group consisting of glucoside alkyl ethers, glycerol alkyl ethers, cocamide ethanolamines and lauryldimethylaminoxide. More preferred surfactants in compositions according to the invention are or comprise perfluorinated, N-substituted alkylsulfonamide ammonium salts. Preferred surfactants (E) in compositions according to the invention do not comprise metals or metal ions.

Particular preferred surfactants are those of formula F1

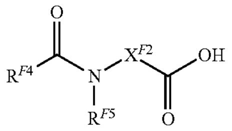

(F1)

wherein $X^{F2}$ is a $C_1$ to $C_4$ alkanediyl;

$R^{F4}$ is a $C_{12}$ to $C_{30}$ alkyl or a $C_{12}$ to $C_{30}$ alkenyl; and $R^{F5}$ is a $C_1$ to $C_4$alkyl.

A composition according to the invention as defined herein is also preferred wherein the amount of the one or more surfactants of the surfactant present is of from about 0.0001 to about 1% by weight, preferably of from about 0.0005 to about 0.5% by weight, more preferably in an amount of from about 0.001 to about 0.01% by weight, based on the total weight of the composition.

Chelating Agents

The etching composition may optionally comprise one or more chelating agents.

Preferred chelating agents are of 1,2-cyclohexylenedinitrilotetraacetic acid, 1,1,1,5,5,5-hexafluoro-2,4-pentane-dione, acetylacetonate, 2,2'-azanediyldiacetic acid, ethylenediamine-tetra-acetic acid, etidronic acid, methanesulfonic acid, acetylacetone, 1,1,1-trifluoro-2,4-pentanedione, 1,4-benzoquinone, 8-hydroxyquinoline, salicyli-dene aniline; tetrachloro-1,4-benzoquinone, 2-(2-hydroxyphenyl)-benzoxazol, 2-(2-hydroxyphenyl)-benzothiazole, hydroxyquinoline sulfonic acid, sulfosali-cylic acid, salicylic acid, pyridine, 2-ethylpyridine, 2-methoxypyridine, 3-methoxypyridine, 2-picoline, dimethylpyridine, piperidine, piperazine, tri-ethylamine, triethanolamine, ethylamine, methylamine, isobutylamine, tert-butylamine, tributylamine, dipropylamine, dimethylamine, diglycol amine, monoethanolamine, methyldiethanolamine, pyrrole, isoxazole, bipyridine, py-rimidine, pyrazine, pyridazine, quinoline, isoquinoline, indole, 1-methylimidazole, diisopropylamine, diisobutylamine, aniline, pentamethyldi-ethylenetriamine, acetoacetamide, ammonium carbamate, ammonium pyrrolidinedithiocarbamate, dimethyl malonate, methyl acetoacetate, N-methyl acetoacetamide, tetramethylammonium thiobenzoate, 2,2,6,6-tetramethyl-3,5-heptanedione, tetramethylthiuram disulfide, lactic acid, ammonium lactate, formic acid, propionic acid, gamma-butyrolactone, and mixtures thereof;

The chelating agent may be 1,2-cyclohexylenedinitrilotetraacetic acid (CDTA) or may comprise CDTA as well as one or more of the other chelating agents above. Compositions according to the invention comprising CDTA as chelating agent have shown a stable and reproducible controlled (selective) etch rate for etching a layer comprising or consisting of an aluminium compound, in particular of aluminium oxide, in the presence of a layer of a low-k material and/or a layer comprising copper and/or cobalt, in particular in the presence of a layer of a low-k material and/or a copper layer: said etch rate on semi-conductor wafers was found to be uniform over a single wafer, with few or no centre-edge effects, and between different wafers.

A composition according to the invention as defined herein is also preferred wherein the amount of the one or more chelating agents present is of from about 0.01 to about 4% by weight, preferably of from about 0.02 to about 1% by weight, more preferably of from about 0.05 to about 0.8% by weight, based on the total weight of the composition.

Composition

In a preferred embodiment the pH of the etching composition is from 4 to 8, particularly from 5 to 7.

A composition according to the invention as defined herein is specifically preferred wherein the composition consists of hydrogen peroxide, ammonium fluoride, a first selectivity enhancer of formula S2 or S4, optionally a second selectivity enhancer of formula S3 and water, as defined herein and to be defined based on the examples.

A composition according to the invention as defined herein is specifically preferred wherein the composition consists of hydrogen peroxide, ammonium fluoride, a first selectivity enhancer of formula S3, optionally a surfactant of formula S4, and water, as defined herein and to be defined based on the examples.

A composition is particularly preferred wherein the composition comprises or consists of (a) one or more oxidizing agents, selected from a peroxide, and preferably the one or more oxidizing agent consist of or comprise hydrogen peroxide, in an amount of from about 5 to about 15% by weight, preferably from about 7 to 13% by weight, most preferably of from 8 to 12% by weight;

(b) one or more etchants comprising a source of fluoride ions, selected from the group consisting of ammonium fluoride, ammonium bifluoride, triethanolammonium fluoride, diglycolammonium fluoride, methyldiethanolammonium fluoride, tetramethylammonium fluoride, triethylamine trihydrofluoride, hydrogen fluoride, fluoroboric acid, tetrafluoroboric acid, ammonium tetrafluoroborate, fluoroacetic acid, ammonium fluoroacetate, trifluoroacetic acid, fluorosilicic acid, ammonium fluorosilicate, tetrabutylammonium tetrafluoroborate and mixtures thereof, and preferably consists of or comprises ammonium fluoride, hydrogen fluoride or a combination thereof, in an amount of from about amount of from about 5 to about 20% by weight, preferably of from about 8 to about 18% by weight, more preferably of from about 10 to about 17.5% by weight, most preferably of from about 12 to about 16% by weight;

(c) a first selectivity enhancer of formula S1, particularly of formula S2, S3, or S4 in an amount of from about 0.0005 to about 0.02% by weight, preferably of from about 0.001 to about 0.005% by weight;

(d) if the first selectivity enhancer is not a compound of formula S3, optionally a second selectivity enhancer of formula S3 in an amount of from about 0.1 to about 3% by weight, preferably of from about 0.5 to about 2% by weight;

(e) one or more acids selected from an inorganic acid and an organic acid, particularly citric acid, or a combination thereof, and preferably consists of or comprises citric in an amount of from about 0.1% to about 5% by weight, more preferably of from about 0.2% to about 4% by weight, even more preferably of from about 0.3% to about 3% by weight most preferably of from about 0.5 to about 2% by weight;

(f) optionally one or more surfactants selected from the group consisting of (i) anionic surfactants, preferably selected from the group consisting of ammonium lauryl sulfate, fluorosurfactants, preferably selected from the group consisting of perfluorinated alkylsulfonamide salts (preferably perfluorinated, N-substituted alkylsulfonamide ammonium salts), perfluorooctanesulfonate, perfluorobutanesulfonate, perfluorononanoate and perfluorooctanoate; alkyl-aryl ether phosphates and alkyl ether phosphates, (ii) zwitterionic surfactants, preferably selected from the group consisting of (3-[(3-cholamidopropyl)dimethylammonio]-1-propanesulfonate), cocamidopropyl hydroxysultaine, {[3-(dodecanoylamino)propyl]-(dimethyl)ammonio}acetate, phosphatidylserine, phosphatidylethanolamine, phosphatidylcholine, (iii) non-ionic surfactants, preferably selected from the group consisting of glucoside alkyl ethers, glycerol alkyl ethers, cocamide ethanolamines and lauryldimethylaminoxide; and preferably the one or more surfactants are or comprise a compound of formula F1, in an amount of from about 0.0005 to about 0.5% by weight, more preferably in an amount of from about 0.001 to about 0.01% by weight;

(g) optionally one or more chelating agents selected from the group consisting of 1,2-cyclohexylenedinitrilotetraacetic acid, 1,1,1,5,5,5-hexafluoro-2,4-pentane-dione, acetylacetonate, 2,2'-azanediyldiacetic acid, ethylenediaminetetra-acetic acid, etidronic acid, methanesulfonic acid, acetylacetone, 1,1,1-trifluoro-2, 4-pentanedione, 1,4-benzoquinone, 8-hydroxyquinoline, salicyli-dene aniline; tetrachloro-1,4-benzoquinone, 2-(2-hydroxyphenyl)-benzoxazol, 2-(2-hydroxyphenyl)-benzothiazole, hydroxyquinoline sulfonic acid, sulfosalicylic acid, salicylic acid, pyridine, 2-ethylpyridine, 2-methoxypyridine, 3-methoxypyridine, 2-picoline, dimethylpyridine, piperidine, piperazine, tri-ethylamine, triethanolamine, ethylamine, methylamine, isobutylamine, tert-butylamine, tributylamine, dipropylamine, dimethylamine, diglycol amine, monoethanolamine, methyldiethanolamine, pyrrole, isoxazole, bipyridine, py-rimidine, pyrazine, pyridazine, quinoline, isoquinoline, indole, 1-methylimidazole, diisopropylamine, diisobutylamine, aniline, pentamethyldiethylenetriamine, acetoacetamide, ammonium carbamate, ammonium pyrrolidinedithiocarbamate, dimethyl malonate, methyl acetoacetate, N-methyl acetoacetamide, tetramethylammonium thiobenzoate, 2,2,6,6-tetramethyl-3,5-heptanedione, tetramethylthiuram disulfide, lactic acid, ammonium lactate, formic acid, propionic acid, gamma-butyrolactone, and mixtures there-of, and preferably is or comprises 1,2-cyclohexylenedinitrilotetraacetic acid, in an amount of from about 0.01 to about 4 wt %, preferably in a total amount of from about 0.02 to about 1 wt %, more preferably in a total amount of from about 0.05 to about 0.8 wt %, based on the total weight of the composition;

(h) water as balance to a total of 100 wt.-% of the composition in each case; and (k) optionally one or more water-miscible organic solvents, preferably selected from the group consisting of tetrahydrofuran (THF), N-methylpyrrolidone (NMP), di-methyl formamide (DMF), dimethyl sulfoxide (DMSO) and sulfolane (2,3,4,5-tetrahydrothiophene-1, 1-dioxide) and mixtures thereof, in an amount of from about 0.1 to about 30 wt %, preferably of from about 0.5 to about 10 wt %, more preferably of from about 1 to about 7.5 wt %, even more preferably of from about 1 to about 6 wt %;

all based on the total weight of the composition, wherein the pH of the composition is of from about 4 to about 8, preferably of from about 5 to about 7, and wherein the % amounts of the components add to 100% by weight in each case.

Another composition is particularly preferred wherein the composition comprises or consists of (a) one or more oxidizing agents, selected from a peroxide, and preferably the one or more oxidizing agent consist of or comprise hydrogen peroxide, in an amount of from about 5 to about 15% by weight, preferably from about 7 to 13% by weight, most preferably of from 8 to 12% by weight;

(b) one or more etchants comprising a source of fluoride ions, selected from the group consisting of ammonium fluoride, ammonium bifluoride, triethanolammonium fluoride, diglycolammonium fluoride, methyldiethanolammonium fluoride, tetramethylammonium fluoride, triethylamine trihydrofluoride, hydrogen fluoride, fluoroboric acid, tetrafluoroboric acid, ammonium tetrafluoroborate, fluoroacetic acid, ammonium fluoroacetate, trifluoroacetic acid, fluorosilicic acid, ammonium fluorosilicate, tetrabutylammonium tetrafluoroborate and mixtures thereof, and preferably consists of or comprises ammonium fluoride, hydrogen fluoride or a combination thereof, in an amount of from about amount of from about 5 to about 20% by weight, preferably of from about 8 to about 18% by weight, more preferably of from about 10 to about 17.5% by weight, most preferably of from about 12 to about 16% by weight;

(c) a (first) selectivity enhancer of formula S1, particularly of formula S2, S3, or S4, most particularly of formula S2 or S4, in an amount of from about 0.0005 to about 0.02% by weight, preferably of from about 0.001 to about 0.005% by weight;

(e) one or more acids selected from an inorganic acid and an organic acid, particularly citric acid, or a combination thereof, and preferably consists of or comprises citric in an amount of from about 0.1% to about 5% by weight, more preferably of from about 0.2% to about 4% by weight, even more preferably of from about 0.3% to about 3% by weight most preferably of from about 0.5 to about 2% by weight;

(f) optionally one or more surfactants selected from the group consisting of (i) anionic surfactants, preferably selected from the group consisting of ammonium lauryl sulfate, fluorosurfactants, preferably selected from the group consisting of perfluorinated alkylsulfonamide salts (preferably perfluorinated, N-substituted alkylsulfonamide ammonium salts), perfluorooctanesulfonate, perfluorobutanesulfonate, perfluorononanoate and perfluorooctanoate; alkyl-aryl ether phosphates and alkyl ether phosphates, (ii) zwitterionic surfactants, preferably selected from the group consisting of (3-[(3-cholamidopropyl)dimethylammonio]-1-propanesulfonate), cocamidopropyl hydroxysultaine, {[3-(dodecanoylamino)propyl]-(dimethyl)ammonio}acetate, phosphatidylserine, phosphatidylethanolamine, phosphatidylcholine, (iii) non-ionic surfactants, preferably selected from the group consisting of glucoside alkyl ethers, glycerol alkyl ethers, cocamide ethanolamines and lauryldimethylaminoxide; and preferably the one or more surfactants are or comprise a compound of formula F1, in an amount of from about 0.0005 to about 0.5% by weight, more preferably in an amount of from about 0.001 to about 0.01% by weight;

(h) water as balance to a total of 100 wt.-% of the composition in each case; and (k) optionally one or more water-miscible organic solvents, preferably selected from the group consisting of tetrahydrofuran (THF), N-methylpyrrolidone (NMP), di-methyl formamide (DMF), dimethyl sulfoxide (DMSO) and sulfolane (2,3,4,5-tetrahydrothiophene-1,1-dioxide) and mixtures thereof, in an amount of from about 0.1 to about 30 wt %, preferably of from about 0.5 to about 10 wt %, more preferably of from about 1 to about 7.5 wt %, even more preferably of from about 1 to about 6 wt %;

all based on the total weight of the composition, wherein the pH of the composition is of from about 4 to about 8, preferably of from about 5 to about 7, and wherein the % amounts of the components add to 100% by weight in each case.

Yet another composition is particularly preferred wherein the composition comprises or consists of (a) one or more oxidizing agents, selected from a peroxide, and preferably the one or more oxidizing agent consist of or comprise hydrogen peroxide, in an amount of from about 5 to about 15% by weight, preferably from about 7 to 13% by weight, most preferably of from 8 to 12% by weight;

(b) one or more etchants comprising a source of fluoride ions, selected from the group consisting of ammonium fluoride, ammonium bifluoride, triethanolammonium fluoride, diglycolammonium fluoride, methyldiethanolammonium fluoride, tetramethylammonium fluoride, triethylamine trihydrofluoride, hydrogen fluoride, fluoroboric acid, tetrafluoroboric acid, ammonium tetrafluoroborate, fluoroacetic acid, ammonium fluoroacetate, trifluoroacetic acid, fluorosilicic acid, ammonium fluorosilicate, tetrabutylammonium tetrafluoroborate and mixtures thereof, and preferably consists of or comprises ammonium fluoride, hydrogen fluoride or a combination thereof, in an amount of from about amount of from about 5 to about 20% by weight, preferably of from about 8 to about 18% by weight, more preferably of from about 10 to about 17.5% by weight, most preferably of from about 12 to about 16% by weight;

(c) a first selectivity enhancer of formula S2, or S4 in an amount of from about 0.0005 to about 0.02% by weight, preferably of from about 0.001 to about 0.005% by weight;

(d) a second selectivity enhancer of formula S3 in an amount of from about 0.1 to about 3% by weight, preferably of from about 0.5 to about 2% by weight;

(e) one or more acids selected from an inorganic acid and an organic acid, particularly citric acid, or a combination thereof, and preferably consists of or comprises citric in an amount of from about 0.1% to about 5% by weight, more preferably of from about 0.2% to about 4% by weight, even more preferably of from about 0.3% to about 3% by weight most preferably of from about 0.5 to about 2% by weight;

(f) optionally one or more surfactants selected from the group consisting of (i) anionic surfactants, preferably selected from the group consisting of ammonium lauryl sulfate, fluorosurfactants, preferably selected from the group consisting of perfluorinated alkylsulfonamide salts (preferably perfluorinated, N-substituted alkylsulfonamide ammonium salts), perfluorooctanesulfonate, perfluorobutanesulfonate, perfluorononanoate and perfluorooctanoate; alkyl-aryl ether phosphates and alkyl ether phosphates, (ii) zwitterionic surfactants, preferably selected from the group consisting of (3-[(3-cholamidopropyl)dimethylammonio]-1-propanesulfonate), cocamidopropyl hydroxysultaine, {[3-(dodecanoylamino)propyl]-(dimethyl)ammonio}acetate, phosphatidylserine, phosphatidylethanolamine, phosphatidylcholine, (iii) non-ionic surfactants, preferably selected from the group consisting of glucoside alkyl ethers, glycerol alkyl ethers, cocamide ethanolamines and lauryldimethylaminoxide; and preferably the one or more surfactants are or comprise a compound of formula F1, in an amount of from about 0.0005 to about 0.5% by weight, more preferably in an amount of from about 0.001 to about 0.01% by weight;

(h) water as balance to a total of 100 wt.-% of the composition in each case; and (k) optionally one or more water-miscible organic solvents, preferably selected from the group consisting of tetrahydrofuran (THF), N-methylpyrrolidone (NMP), di-methyl formamide (DMF), dimethyl sulfoxide (DMSO) and sulfolane (2,3,4,5-tetrahydrothiophene-1,1-dioxide) and mixtures thereof, in an amount of from about 0.1 to about 30 wt %, preferably of from about 0.5 to about 10 wt %, more preferably of from about 1 to about 7.5 wt %, even more preferably of from about 1 to about 6 wt %;

all based on the total weight of the composition, wherein the pH of the composition is of from about 4 to about 8, preferably of from about 5 to about 7, and wherein the % amounts of the components add to 100% by weight in each case.

Application

The composition is particularly useful for selectively etching a layer comprising a silicon germanium alloy (SiGe) in the presence of a layer comprising Si, in particular aSi.

It will be appreciated that it is common practice to make concentrated forms of the compositions to be diluted prior to use. For example, the compositions may be manufactured in a more concentrated form and thereafter diluted with water, at least one oxidizing agent, or other components at the manufacturer, before use, and/or during use. Dilution ratios may be in a range from about 0.1 parts diluent to 1 parts composition concentrate to about 100 parts diluent to 1 part composition concentrate.

Accordingly, one embodiment relates to a kit including, in one or more containers, one or more components adapted to form the compositions described herein. Preferably, one container comprises the at least one oxidizing agent and a second container comprises the remaining components, e.g., at least one etchant, at least selectivity enhancer, water, and optionally other components described herein, for combining at the fab or the point of use.

In the use of the compositions described herein, the composition typically is contacted with the device structure for a sufficient time of from about 1 minute to about 200 minutes, preferably about 5 minutes to about 60 minutes, at temperature in a range of from about 10° C. to about 80° C., preferably about 20° C. to about 60° C. Such contacting times and temperatures are illustrative, and any other suitable time and temperature conditions may be employed that are efficacious to achieve the required removal selectivity. One advantage of the composition according to the present invention is its low temperature dependence of the SiGe/Si etch ratio. Particularly the SiGe etch rate and the SiGe/Si etch ratio is still very high at temperatures below 30° C. so that the substrates may be processed at room temperature.

Following the achievement of the desired etching action, the composition can be readily removed from the microelectronic device to which it has previously been applied, e.g., by rinse, wash, or other removal step(s), as may be desired and efficacious in a given end use application of the compositions of the present invention. For example, the device may be rinsed with a rinse solution including deionized water, an organic solvent, and/or dried (e.g., spin-dry, $N_2$, vapor-dry etc.).

It may be useful to clean the blanket wafer surfaces for approx 30 s with an aqueous solution containing 0.3% by weight HF at room temperature.

The etching composition described herein may be advantageously used for selectively etching a layer comprising SiGe in the presence of a layer comprising or consisting of S.

The etching composition described herein may be advantageously used in a process of selectively removing a layer comprising silicon-germanium from a surface of a microelectronic device relative to a comprising or consisting of Si, the process comprising:

(a) providing a microelectronic device surface that includes silicon and silicon-germanium, (b) providing a composition as described herein, and (c) contacting the surface with the composition for a time and at a temperature effective to selectively remove the layer comprising silicon-germanium relative to the layer comprising or consisting of silicon.

Preferably the SiGe etch rates of the compositions according to the invention are 200 A/min or more, more preferably 300 A/min or more. Preferably the Si, particularly aSi etch rates of the compositions according to the invention are 2 A/min or below, more preferably 1 A/min or below. Preferably the etch rate of the layer comprising silicon-germanium is at least 500, preferably 750, even more preferably 1000, even more preferably 2000, most preferably more than 5000 times faster than the etch rate of the layer comprising or consisting of Si (SiGe/Si selectivity).

The etching composition described herein may be advantageously used in a process for the manufacture of a semiconductor device, comprising the step of selectively removing silicon-germanium from a surface of a microelectronic device relative to a material comprising or consisting of silicon described herein.

The following examples shall further illustrate the present invention without restricting the scope of this invention.

EXAMPLES

The following substrates were used: SALSA III by IMEC as shown in FIG. 1. The substrate comprised several stacked SiGe and aSi layers. SALSA 3 layer build up from top to bottom: $SiO_2$ (50 nm)-SiN (50 nm)-SiO2 (5 nm)-Si (25 nm)-SiGe (25 nm)-Si (20 nm)-SiGe (20 nm) Si (15 nm)-SiGe (15 nm)-Si (10 nm)-SiGe (10 nm)-Si (5 nm)-SiGe (5 nm)-Si<100> Wafer (ca. 0.70 mm). All SiGe layer contained 25% by weight of Germanium.

The following materials were used in electronic grade purity:

$H_2O_2$ (31%)

$NH_4F$ citric acid

Surfynol® 104 (available from Evonik)

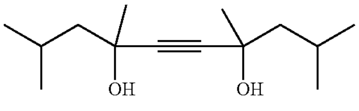 [SMILES: CC(C)CC(C)(O)C#CC(C)(O)CC(C)C]

Perlastan® C (available e.g. from Schill+Seilacher)

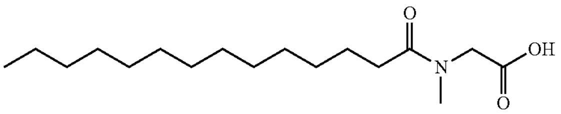 [SMILES: CCCCCCCCCCCCCC(=O)N(C)CC(=O)O]

The Perlastan® C stock solution (0.25 wt % in water suspension) was stirred with 500 rpm at room temperature until a turbid emulsion forms before its use.

acetylene dicaboxylic acid (available e.g. from Sigma-Aldrich)

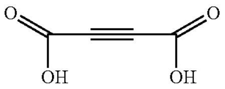

Acetylenedicarboxylic acid was used as a solution of 2.57 g acetylenedicarboxylic acid dissolved in 77.28 g water in a plastic beaker.

HF (50%)

Water (Ultrapure, UPW)

All amounts given for the compounds in the compositions are absolute amounts, i.e. excluding water, in the overall mixture.

Etch Bath Preparation:

The etching bath vessel was set to a temperature of 30° C.+/−0.5° C. 2.00 g of the stirred, turbid Perlastan C stock solution were added to the bath solution. 80.65 g 31 wt % hydrogen peroxide was added to the bath solution, which after mixing resulted in a clear solution. The bath solution was transferred to the etch bath vessel and stirred with 300 rpm. 87.50 g of a 40 wt % ammonium fluoride solution were weighed into the plastic beaker, used before for pre-mixing Perlastan C, water and acetylenedicarboxylic acid. The aqueous ammonium fluoride solution was then also transferred to the etch bath vessel.

Pre-Etching:

UPW and 1 wt % hydrogen fluoride are filled into two plastic beakers

Each coupon (SiGe25, aSi, $SiO_2$, SiN) was pre-etched in 1 wt % hydrogen fluoride for 30 s, then dipped into UPW for 2-3 s and dried with compressed air.

Etching:

After an aging time of the etch bath of 40 min, the coupons are etched separately in the etch bath in the following order: 2×SiGe25 for 15 s, $SiO_2$ for 240 s, SiN for 600 s, and aSi for 900 s. After etching, the coupons were rinsed with UPW and dried with compressed air.

Example 1

The compositions listed in table 1a were prepared.

TABLE 1a

| | C-Ex 1.1 | Ex 1.2 | Ex 1.3 | Ex 1.4 | Ex 1.5 |
|---|---|---|---|---|---|
| $NH_4F$ | 14.0% | 14.0% | 14.0% | 14.0% | 14.0% |
| $H_2O_2$ | 10.0% | 10.0% | 10.0% | 10.0% | 10.0% |
| citric acid | 1.00% | 1.00% | 1.00% | 1.00% | 1.00% |
| Surfynol ® 104 | | 0.0050% | 0.0020% | 0.0010% | 0.0005% |
| Water | 75.0% | 75.0% | 75.0% | 75.0% | 75.0% |

The etching rates were determined by ellipsometry by comparing the layer thickness before and after etching. The results are depicted in table 1b.

TABLE 1b

| | C-Ex 1.1 | Ex 1.2 | Ex 1.3 | Ex 1.4 | Ex 1.5 |
|---|---|---|---|---|---|
| aSi | 13.2 | 0.2 | 0.5 | 0.7 | 1.2 |
| SiGe(25%) | 1068 | 152 | 976 | 964 | 1032 |
| Selectivity SiGe/aSi | 81 | 760 | 1952 | 1377 | 860 |

Tables 1b shows that the addition of Surfynol® 104, a dihydroxy alkyne, significantly increases the SiGe/aSi selectivity. The optimal concentration window is at very low concentrations around 0.0020% by weight. An increase as well as a decrease of the concentration reduces the SiGe/aSi selectivity.

Example 2

The compositions listed in table 2a were prepared.

TABLE 2a

| | Ex 2.1 | Ex 2.2 | C-Ex 2.3 | C-Ex 2.4 | C-Ex 2.5 | C-Ex 2.6 |
|---|---|---|---|---|---|---|
| $NH_4F$ | 14.0% | 14.0% | 14.0% | 14.0% | 14.0% | 14.0% |
| $H_2O_2$ | 10.0% | 10.0% | 10.0% | 10.0% | 10.0% | 10.0% |
| citric acid | 1.00% | 1.00% | 1.00% | 1.00% | 1.00% | 1.00% |
| Surfynol 104 | 0.0010% | 0.0005% | — | — | — | — |
| Surfynol 465 | — | — | 0.0010% | 0.0005% | — | — |
| Surfynol 485 | — | — | — | — | 0.0010% | 0.0005% |
| Water | 75.0% | 75.0% | 75.0% | 75.0% | 75.0% | 75.0% |

The etching rates were determined by ellipsometry by comparing the layer thickness before and after etching. The results are depicted in table 2b.

TABLE 2b

| | Ex 2.1 | Ex 2.2 | C-Ex 2.3 | C-Exp 2.4 | C-Exp 2.5 | C-Exp 2.6 |
|---|---|---|---|---|---|---|
| aSi | 0.7 | 1.2 | 1.7 | 1.7 | 2.4 | 2.6 |
| SiGe(25%) | 964 | 1032 | 200 | 572 | 296 | 408 |
| Selectivity SiGe/aSi | 1377 | 860 | 118 | 336 | 123 | 157 |

Tables 2b shows that only the addition of Surfynol 104 (Ex 2.1+2.2), a dihydroxy alkyne, increases the SiGe etch rate and rather decreases the aSi etch rate that results in a very high SiGe/aSi selectivity. In contrast, Surfynol 465 and Surfynol 485 (C-Ex 2.3-2.6), which are polyethoxylated alkynes, show much lower SiGe and higher aSi etch rates that result in a lower SiGe/aSi selectivity.

Example 3

The compositions listed in table 3a were prepared.

TABLE 3a

| | Exp 3.1 | Exp 3.2 | Exp 3.3 | Exp 3.4 |
|---|---|---|---|---|
| $NH_4F$ | 14.0% | 14.0% | 14.0% | 14.0% |
| $H_2O_2$ | 10.0% | 10.0% | 10.0% | 10.0% |
| acetylene dicarboxylic acid | 1.00% | 1.00% | 1.00% | 1.00% |
| Perlastan C | — | 0.0200% | 0.0050% | 0.0020% |
| Water | 75.0% | 75.0% | 75.0% | 75.0% |

The etching rates were determined by ellipsometry by comparing the layer thickness before and after etching. The results are depicted in table 3b.

TABLE 3b

| | Ex 3.1 | Ex 3.2 | Ex 3.3 | Ex 3.4 |
|---|---|---|---|---|
| aSi | 2.2 | 2.2 | 1.7 | 1.3 |
| SiGe(25%) | 1107 | 1163 | 1405 | 1364 |
| Selectivity SiGe/aSi | 503 | 529 | 826 | 1049 |

Tables 3b shows that the use of Perlastan C, if used in low concentrations of 0.001 to 0.01% by weight, further increases the SiGe/aSi selectivity.

Example 4

The compositions listed in table 4a were prepared.

TABLE 4a

| | Ex 4.1 | Ex 4.2 |
|---|---|---|
| $NH_4F$ | 14.0% | 14.0% |
| $H_2O_2$ | 10.0% | 10.0% |
| citric acid | 1.0% | — |
| acetylenedicarboxylic acid | — | 1.00% |
| Surfynol 104 | 0.0050% | 0.0050% |
| Water | 75.0% | 75.0% |

The etching rates were determined by ellipsometry by comparing the layer thickness before and after etching. The experiments were conducted at 20° C. The results are depicted in table 4b.

TABLE 4b

| | Exp 4.1 | Exp 4.2 |
|---|---|---|
| aSi | 0.1 | <0.01 |
| SiGe(25%) | 304 | 424 |
| Selectivity SiGe/aSi | 3040 | $>4.2 \cdot 10^4$ |

Tables 4b shows that the use of acetylene dicarboxylic acid as second acetylenic compound (Exp. 4.2) instead of citric acid (Exp 4.1) further reduces the aSi etch rate below the detection limit, i.e. essentially only SiGe is etched.

The invention claimed is:

1. A composition comprising:

(a) 5 to 15% by weight of an oxidizing agent;

(b) 5 to 20% by weight of an etchant comprising a source of fluoride ions;

(c) 0.0005 to 3% by weight of a first selectivity enhancer of formula S1

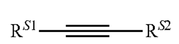

(S1)

and (d) water;

wherein $R^{S1}$ is selected from $X^S$—OH and $Y^S$—(CO)—OH;

$R^{S2}$ is selected from (i) $R^{S1}$, (ii) H, (iii) $C_1$ to $C_{10}$ alkyl, (iv) $C_1$ to $C_{10}$ alkenyl, (v) $C_1$ to $C_{10}$ alkynyl, and (vi) —$X^{S1}$—(O—$C_2H_3R^{S6}$)$_m$—$OR^{S6}$;

$R^{S6}$ is selected from H and $C_1$ to $C_6$ alkyl;

$X^S$ is selected from a linear or branched $C_1$ to $C_{10}$ alkanediyl, a linear or branched $C_2$ to $C_{10}$ alkenediyl, linear or branched $C_2$ to $C_{10}$ alkynediyl, and —$X^{S1}$—(O—$C_2H_3R^6$)$_m$—;

$Y^S$ is selected from the group consisting of a chemical bond and $X^S$;

$X^{S1}$ is a $C_1$ to $C_6$ alkanediyl;

m is an integer of from 1 to 5;

wherein the composition has a pH of from 4 to 8; and wherein the composition is suitable for selectively etching a first layer comprising a silicon germanium alloy $Si_xGe_y$, wherein x is from 0.70 to 0.90 and y is from 0.10 to 0.30, with x+y=1.00, in the presence of a second layer consisting of silicon, wherein an etch rate of the composition for the first layer is at least 500 times an etch rate of the composition for the second layer.

2. The composition according to claim 1, wherein the oxidizing agent is selected from the group consisting of peroxides.

3. The composition according to claim 1, wherein the oxidizing agent is present in an amount of from 7 to 13% by weight.

4. The composition according to claim 1, wherein the etchant is selected from the group consisting of hydrogen fluoride, ammonium fluoride, ammonium bifluoride, triethanolammonium fluoride, diglycolammonium fluoride, methyldiethanolammonium fluoride, tetramethylammonium fluoride, triethylamine trihydrofluoride, fluoroboric acid, tetrafluoroboric acid, ammonium tetrafluoroborate, fluoroacetic acid, ammonium fluoroacetate, trifluoroacetic acid, fluorosilicic acid, ammonium fluorosilicate, tetrabutylammonium tetrafluoroborate and mixtures thereof.

5. The composition according to claim 1, wherein the etchant is present in an amount of from 8 to 18% by weight.

6. The composition according to claim 1, wherein the first selectivity enhancer is present in an amount of (a) from 0.0005 to 0.02% by weight, if $R^{S1}$ is $X^S$—OH, or (b) from 0.1 to 3% by weight, if $R^{S1}$ is $Y^S$—(CO)—OH.

7. The composition according to claim 1, wherein $R^{S1}$ is $X^S$—OH and $X^S$ is a $C_1$ to $C_8$ alkanediyl.

8. The composition according to claim 7, wherein the first selectivity enhancer is a compound of formula S2

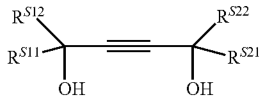

(S2)

wherein $R^{S11}$, $R^{S21}$ are independently selected from the group consisting of a $C_1$ to $C_6$ alkyl, $R^{S12}$, $R^{S22}$ are independently selected from the group consisting of H and a $C_1$ to $C_{10}$ alkyl.

9. The composition according to claim 1, wherein the first selectivity enhancer is a compound of formula S3

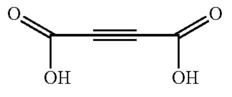

(S3)

or, if the first selectivity enhancer is a compound of formula S2, the composition further comprises a second acetylenic compound of formula S3.

10. The composition according to claim 1, further comprising an organic acid selected from the group consisting of hydroxy carboxylic acids.

11. The composition according to claim 1, further comprising a surfactant of formula F1

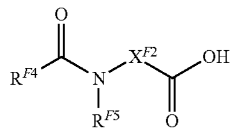

(F1)

wherein $X^{F2}$ is a $C_1$ to $C_4$ alkanediyl;

$R^{F4}$ is a $C_{12}$ to $C_{30}$ alkyl or a $C_{12}$ to $C_{30}$ alkenyl; and $R^{F5}$ is a $C_1$ to $C_4$ alkyl.

12. A method of using the composition of claim 1, the method comprising using the composition for selectively etching a layer comprising $Si_xGe_y$, wherein x is from 0.70 to 0.90 and y is from 0.10 to 0.30, with x+y=1.00, in the presence of a layer consisting of silicon.

13. A process of selectively removing a layer comprising a silicon germanium alloy $Si_xGe_y$, wherein x is from 0.70 to 0.90 and y is from 0.10 to 0.30, with x+y=1.00, from a surface of a microelectronic device relative to a layer consisting of silicon, the process comprising:

(a) providing a microelectronic device surface that includes the layer comprising the silicon germanium alloy and the layer consisting of silicon, (b) providing a composition according to claim 1, and (c) contacting the surface with the composition for a time and at a temperature effective to selectively remove the layer comprising silicon-germanium relative to the layer consisting of silicon.

14. A process for the manufacture of a semiconductor device, comprising the step of selectively removing the layer comprising silicon-germanium from a surface of a microelectronic device relative to the layer consisting of silicon according to claim 13.

15. The composition according to claim 1, wherein the oxidizing agent is hydrogen peroxide.

16. The composition according to claim 1, wherein the oxidizing agent is present in an amount of from 8 to 12% by weight.

17. The composition according to claim 1, wherein the etchant is hydrogen fluoride.

18. The composition according to claim 1, wherein the etchant is present in an amount of from of from 12 to 16% by weight.

19. The composition according to claim 1, wherein the first selectivity enhancer is present in an amount of (a) from 0.001 to 0.005% by weight, if $R^{S1}$ is $X^{S}$—OH, or (b) from 0.5 to 2% by weight, if $R^{S1}$ is $Y^{S}$—(CO)—OH.

20. The composition according to claim 1, wherein $R^{S1}$ is $C_1$ to $C_6$ alkane-1,1-diyl.

21. The composition according to claim 1, wherein the first selectivity enhancer is of formula S3 or formula S4

(S3)

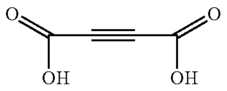

(S4)

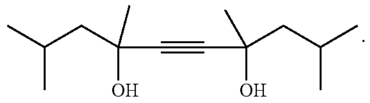

* * * * *